United States Patent
Lutz et al.

(10) Patent No.: US 10,700,168 B2
(45) Date of Patent: Jun. 30, 2020

(54) WIDE BAND GAP SEMICONDUCTOR DEVICE AND A METHOD FOR FORMING A WIDE BAND GAP SEMICONDUCTOR DEVICE

(71) Applicant: Infineon Technologies AG, Neubiberg (DE)

(72) Inventors: Josef Lutz, Chemnitz (DE); Roland Rupp, Lauf (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/232,419

(22) Filed: Dec. 26, 2018

(65) Prior Publication Data

US 2019/0198621 A1   Jun. 27, 2019

(30) Foreign Application Priority Data

Dec. 27, 2017   (DE) .................. 10 2017 131 354

(51) Int. Cl.
   *H01L 29/10*   (2006.01)
   *H01L 29/16*   (2006.01)
   (Continued)

(52) U.S. Cl.
   CPC .... *H01L 29/1608* (2013.01); *H01L 21/02529* (2013.01); *H01L 21/26513* (2013.01);
   (Continued)

(58) Field of Classification Search
   CPC ......... H01L 29/06; H01L 29/10; H01L 29/16; H01L 29/36; H01L 29/78; H01L 29/73;
   (Continued)

(56) References Cited

U.S. PATENT DOCUMENTS

| 8,354,709 B2 | 1/2013 | Schulze et al. |
| 2013/0221401 A1 | 8/2013 | Ogura et al. |

(Continued)

FOREIGN PATENT DOCUMENTS

| DE | 3823795 A1 | 1/1990 |
| DE | 102016111844 A1 | 12/2017 |
| EP | 0103138 A2 | 3/1984 |

OTHER PUBLICATIONS

Shoji, Tomoyuki, et al., "Neutron Induced Single-Event Burnout in SiC Power Diode", Extended Abstracts of the 2013 International Conference on Solid State Devices and Materials, Fukuoka, 2013, pp. 954-955.

*Primary Examiner* — Chuong A Luu
(74) *Attorney, Agent, or Firm* — Murphy, Bilak & Homiller, PLLC

(57) ABSTRACT

A wide band gap semiconductor device includes a first doping region of a first conductivity type and a second doping region of a second conductivity type. A drift portion of the second doping region has a first average net doping concentration lower than $1e17$ $cm^{-3}$. A highly doped portion of the second doping region has a second average net doping concentration higher than $5e18$ $cm^{-3}$. A compensation portion of the second doping region located between the drift and highly doped portions extends from a first area with a net doping concentration higher than $1e16$ $cm^{-3}$ and lower than $1e17$ $cm^{-3}$ to a second area with a net doping concentration higher than $5e18$ $cm^{-3}$. A maximum gradient of the net doping concentration within at least a part of the compensation portion extending from the second area towards the first area for at least 100 nm is lower than $5e22$ $cm^{-4}$.

15 Claims, 4 Drawing Sheets

(51) Int. Cl.
*H01L 29/861* (2006.01)
*H01L 29/36* (2006.01)
*H01L 21/265* (2006.01)
*H01L 21/02* (2006.01)
*H01L 29/20* (2006.01)
*H01L 29/78* (2006.01)
*H01L 29/739* (2006.01)

(52) U.S. Cl.
CPC ...... *H01L 29/1004* (2013.01); *H01L 29/1095* (2013.01); *H01L 29/36* (2013.01); *H01L 29/861* (2013.01); *H01L 29/8611* (2013.01); H01L 29/20 (2013.01); *H01L 29/2003* (2013.01); *H01L 29/7395* (2013.01); *H01L 29/7802* (2013.01)

(58) Field of Classification Search
CPC ... H01L 29/861; H01L 29/20; H01L 29/1004; H01L 29/1608; H01L 29/1095; H01L 29/8611; H01L 29/2003; H01L 29/7395; H01L 29/7802; H01L 29/739; H01L 29/8618; H01L 29/7781; H01L 29/7787; H01L 29/7786
USPC .......................................................... 257/77
See application file for complete search history.

(56) References Cited

U.S. PATENT DOCUMENTS

2016/0049474 A1* 2/2016 Schmidt ................ H01L 29/167
257/590
2016/0064206 A1* 3/2016 Schulze ............ H01L 21/02008
257/655

* cited by examiner

WIDE BAND GAP SEMICONDUCTOR DEVICE AND A METHOD FOR FORMING A WIDE BAND GAP SEMICONDUCTOR DEVICE

TECHNICAL FIELD

Examples relate to wide band gap devices and methods for manufacturing wide band gap semiconductor devices.

BACKGROUND

A wide band gap semiconductor device can for example be a power semiconductor device that comprises silicon carbide (SiC). Such a power semiconductor device can be a metal-oxide-semiconductor field-effect transistor (MOSFET) or a diode, for example.

In an off-state of a wide band gap semiconductor device, a space charge zone can propagate in a drift zone of the wide band gap semiconductor device. Some wide band gap semiconductor devices may be susceptible to specific external events like ionization, cosmic radiation and/or cosmic radiation caused streamers, which can lead to a malfunction of the component. A said specific external event may cause a generation of charge carriers and lead to an avalanche breakdown of the wide band gap semiconductor device. It may be desired to obtain more robust wide band gap semiconductor devices. There may be a demand to provide concepts for wide band gap semiconductor devices with improved robustness, and/or increased reliability, and/or increased life time.

SUMMARY

Some embodiments relate to a wide band gap semiconductor device. A wide band gap semiconductor of the wide band gap semiconductor device 100 comprises a first doping region of a first conductivity type and a second doping region of a second conductivity type. The second doping region comprises a drift portion, a compensation portion and a highly doped portion. The drift portion of the second doping region has a first average net doping concentration lower than 1e17 $cm^{-3}$. The highly doped portion of the second doping region has a second average net doping concentration higher than 5e18 $cm^{-3}$. The compensation portion of the second doping region is located between the drift portion and the highly doped portion. The compensation portion extends from a first area comprising a net doping concentration higher than 1e16 $cm^{-3}$ and lower than 1e17 $cm^{-3}$ to a second area comprising a net doping concentration higher than 5e18 $cm^{-3}$. A maximum gradient of the net doping concentration within at least a part of the compensation portion extending from the second area towards the first area for at least 100 nm is lower than 5e22 $cm^{-4}$.

Some embodiments relate to a method for forming a wide band gap semiconductor device. The method comprises forming a first doping region of a wide band gap semiconductor of the wide band gap semiconductor device. The first doping region comprises a first conductivity type. The method comprises forming a second doping region of the wide band gap semiconductor. The second doping region comprises a second conductivity type. A drift portion of the second doping region has a first average net doping concentration lower than 1e17 $cm^{-3}$. A highly doped portion of the second doping region has a second average net doping concentration higher than 5e18 $cm^{-3}$. A compensation portion of the second doping region is located between the drift portion and the highly doped portion. The compensation portion extends from a first area comprising a net doping concentration higher than 1e16 $cm^{-3}$ and lower than 1e17 $cm^{-3}$ to a second area comprising a net doping concentration higher than 5e18 $cm^{-3}$. A maximum gradient of the net doping concentration within at least a part of the compensation portion extending from the second area towards the first area for at least 100 nm is lower than 5e22 $cm^{-4}$. Using the method may make it possible to form, or provide, or manufacture wide band gap semiconductor devices with improved robustness against specific external events like cosmic radiation and cosmic-radiation-induced streamers within the wide band gap semiconductor devices.

Those skilled in the art will recognize additional features and advantages upon reading the following detailed description, and upon viewing the accompanying drawings.

BRIEF DESCRIPTION OF THE FIGURES

Some examples of devices, apparatuses and/or methods will be described in the following by way of example only, and with reference to the accompanying figures, in which.

DETAILED DESCRIPTION

Figure 1:
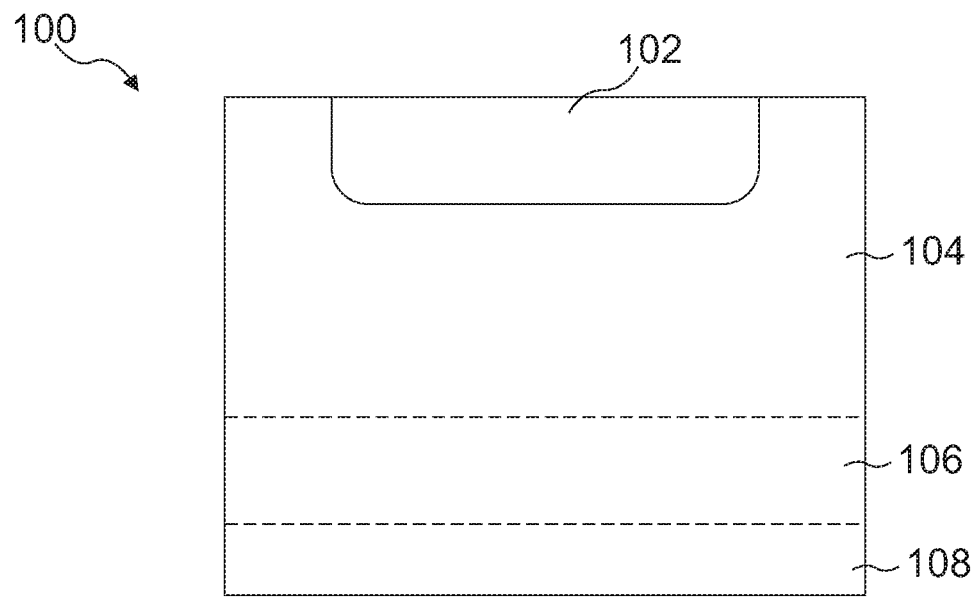
FIG. 1 shows a schematic illustration of a wide band gap semiconductor device.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

With wide band gap semiconductor devices, e.g. SiC-based power semiconductor devices, like e.g. Power MOSFETs or diodes, there may be critical operating states which may appear when cosmic radiation caused streamers occur in the device. These critical operating states may lead in some cases to electrical failures and accordingly may be decisive for the reliability of power semiconductor devices. This can be aggravated by the fact that in case of an abrupt occurrence of cosmic radiation caused streamers there might be no possibility of detection. Providing a stability against cosmic radiation may be provided by technical measures as described in connection with examples above or below.

FIG. 1 shows a wide band gap semiconductor device 100. A wide band gap semiconductor of the wide band gap semiconductor device 100 comprises a first doping region 102 and a second doping region. The first doping region 102 has a first conductivity type and the second doping region has a second conductivity type. The second doping region comprises a drift portion 104 having a first average net doping concentration that is lower than $1e17$ $cm^{-3}$. A highly doped portion 108 of the second doping region has a second average net doping concentration that is higher than $5e18$ $cm^{-3}$. A compensation portion 106 of the second doping region is located between the drift portion 104 and the highly doped portion 108. The compensation portion 106 extends from a first area that has a net doping concentration that is higher than $1e16$ $cm^{-3}$ and that is lower than $1e17$ $cm^{-3}$ to a second area that comprises a net doping concentration that is higher than $5e18$ $cm^{-3}$. A maximum gradient of the net doping concentration within at least a part of the compensation portion 106 extending from the second area towards the first area for at least 100 nm is lower than $5e22$ $cm^{-4}$.

Within the proposed compensation portion 106, the electrical charge of at least a part of charge carriers generated by cosmic radiation may be compensated by the provided doping profile within the compensation portion 106. In this way, high electric field peaks may be avoided or decreased. Therefore, an avalanche breakdown may be avoided in the wide band gap semiconductor device. Thus, the implementation of the compensation portion 106 may increase the robustness, the reliability and/or the life time of the wide band gap semiconductor device. For example, the compensation portion 106 may be implemented in the wide band gap semiconductor device 100 in order to protect the wide band gap semiconductor device 100 against malfunction or destruction in some cases of specific external events like cosmic radiation.

For example, the first doping region 102 may be an anode region of a diode, a cathode region of a diode, a body region of a field effect transistor and/or a base region of a bipolar transistor. The first doping region 102 may be located between a frontside surface of the wide band gap semiconductor and the second doping region and may form a part of the frontside surface. For example, the first doping region 102 may be located between a source region of a field effect transistor and the drift portion 104 of the second doping region implementing a drift zone of the field effect transistor. The first doping region 102 comprises the opposite conductivity type of the second doping region. For example, the first doping region 102 may be p-doped and the second doping region and consequently the drift portion 104, the compensation portion 106 and the highly doped portion may be n-doped, or vice versa. For example, the first doping region 102 is located adjacent to the second doping region so that a p-n-junction exists between the first doping region 102 and the second doping region.

The drift portion 104 of the second doping region may be a region of the wide band gap semiconductor depletable in a blocking-state of the wide band gap semiconductor device 100 to obtain a large depletion region for blocking applied voltages. For example, the drift portion 104 of the second doping region comprises a low net doping concentration in comparison to the compensation portion and the highly doped portion. The average net doping concentration of the drift portion 104 is lower than $1e17$ $cm^{-3}$ (and/or lower than $1e16$ $cm^{-3}$, or lower than $5e15$ $cm^{-3}$) and may be determined by averaging the net doping concentration within the area of the wide band gap semiconductor occupied by the drift portion 104. The net doping concentration is the absolute value of the difference between the concentration of donors $N_D$ and the concentration of acceptors $N_A$. Further, the drift portion 104 may comprise a maximum net doping concentration lower than $1e17$ $cm^{-3}$ (or lower than $1e16$ $cm^{-3}$, or lower than $5e15$ $cm^{-3}$). The drift portion 104 may extend vertically from the first doping region 102 to the first area of the compensation portion or to a field stop portion located between the drift portion 104 and the compensation portion 106.

The highly doped portion 108 may be used to obtain an ohmic contact to a backside contact metallization and/or to obtain a sufficient thickness of the wide band gap semiconductor to enable secure handling of the wide band gap semiconductor and/or to provide sufficient mechanical stability, while keeping the influence on the on-resistance low. The highly doped portion 108 may be located at a backside surface of the wide band gap semiconductor and electrically connected by a backside metallization structure at the backside surface of the wide band gap semiconductor. Alternatively, the highly doped portion 108 may be a backside emitter or collector region of an IGBT of the first conductivity type. For example, the highly doped portion 108 may extend from the compensation portion 106 to the backside surface. The highly doped portion 108 comprises a high net doping concentration compared to the compensation portion and the drift portion to keep influence on on-resistance low and/or enable an ohmic contact to a contact electrode. The average net doping concentration of the highly doped portion 108 is higher than $5e18$ $cm^{-3}$ (or higher than $1e19$ $cm^{-3}$, or higher than $5e19$ $cm^{-3}$) and may be determined by averaging the net doping concentration within the area of the wide band gap semiconductor occupied by the highly doped portion 108. Further, the highly doped portion 108 may comprise a minimum net doping concentration higher than 5e18 cm$^{-3}$ (or higher than 1e19 cm$^{-3}$, or higher than 5e19 cm$^{-3}$).

As mentioned above, the compensation portion 106 may be implemented to increase the robustness of the wide band gap semiconductor device 100. For example, the compensation portion 106 is located vertically between the drift portion 104 and the highly doped portion 108. The compensation portion 106 may extend from the highly doped portion 108 to the drift portion 104 or a field stop portion. The first area of the compensation 106 may be an area of the compensation portion 106 located adjacent to the drift portion 104 or a field stop portion and the second area of the compensation 106 may be an area of the compensation portion 106 located adjacent to the highly doped portion 108. Alternatively, one or more other portions of the second doping region may be located between the highly doped portion 108 and the compensation portion 106 and/or between the drift portion 104 and the compensation portion 106. The interface of the compensation portion 106 towards the drift portion 104 may be defined by the first area comprising a net doping concentration higher than 1e15 cm$^{-3}$ (or higher than 5e15 cm$^{-3}$) and lower than 1e17 cm$^{-3}$ (or lower than 5e16 cm$^{-3}$). The border of the compensation portion 106 towards the highly doped portion 108 may be defined by the second area comprising a net doping concentration higher than 5e18 cm$^{-3}$ (or higher than 1e19 cm$^{-3}$, or higher than 5e19 cm$^{-3}$).

Further, in order to obtain good compensation of radiation-induced charge carriers, the increase of the net doping concentration within the compensation portion may be selected moderately. For example, the maximum gradient of the net doping concentration within at least a part of the compensation portion 106 extending from the second area towards the first area for at least 100 nm (or at least 200 nm or at least 500 nm) is lower than 5e22 cm$^{-4}$ (or lower than 1e22 cm$^{-4}$, or lower than 5e21 cm$^{-4}$). In other words, the gradient of the net doping concentration within the compensation portion 106 stays below 5e22 cm$^{-4}$ over a vertical extension of at least 100 nm starting at an area with a net doping concentration higher than 5e18 cm$^{-3}$ and extending towards an area with a net doping concentration higher than 1e15 cm$^{-3}$ and lower than 1e17 cm$^{-3}$. Optionally, the net doping concentration may be lower than 5e22 cm$^{-4}$ (or lower than 1e22 cm$^{-4}$, or lower than 5e21 cm$^{-4}$) within the whole compensation portion 106. Furthermore, in order to keep the influence of the compensation portion to the on-resistance low, a minimum gradient of the net doping concentration within the compensation portion 106 may be higher than 1e21 cm$^{-4}$ (or higher than 2e21 cm$^{-4}$, or higher than 4e21 cm$^{-4}$).

The vertical extension of the compensation portion 106 may be selected depending on the vertical extension of the drift portion, while the vertical extension of the drift portion may be selected depending on the voltage class of the wide band gap semiconductor device 100. For example, the drift portion may comprise a vertical extension between at least 8 μm and at most 12 μm for a 1200V device or between at least 4 μm and at most 7 μm for a 600V device. For example, a vertical extension of the drift portion 104 may be larger than (e.g. larger than two times, larger than three times or larger than five times) a vertical distance between the first area of the compensation portion 106 and the second area of the compensation portion 106. For example, the vertical extension of the drift portion 104 is smaller than eight times (or smaller than ten times or smaller than five times) the vertical distance between the first area of the compensation portion and the second area of the compensation portion 106.

For example, the vertical extension of the compensation portion, and/or the vertical distance between the first area of the compensation portion 106 and the second area of the compensation portion 106, may be larger than 1 μm (or larger than 2 μm, larger than 4 μm, or larger than 5 μm) and/or smaller than 10 μm (or smaller than 8 μm, or smaller than 5 μm).

Optionally, a doping profile of the compensation portion may comprise a doping plateau. The doping plateau may have an average gradient of the net doping concentration of less than 1e21 cm$^{-4}$ (or less than 1e19 cm$^{-4}$ or less than 1e17 cm$^{-4}$) and the doping plateau may comprise a vertical extension of more than 50 nm (or more than 80 nm or more than 100 nm). For example, the doping profile of the wide band gap semiconductor device comprises a plurality of doping plateaus resulting in a step-shaped doping profile (e.g. FIG. 3). An average gradient of the net doping concentration of at least one (or of all plateaus) of the plateaus is less than 5e20 cm$^{-4}$. In some examples, the plurality of doping plateaus comprises two, three, four or more doping plateaus. The different doping plateaus of the plurality of doping plateaus can comprise respective different average net doping concentrations. For example, a doping plateau located closest to the drift portion 104 can comprise an average net doping concentration of at least 2e16 cm$^{-3}$ (or of at least 1e17 cm$^{-3}$, or of at least 5e17 cm$^{-3}$). For example, a difference between respective average net doping concentrations of neighboring doping plateaus can be smaller than 1e18 cm$^{-3}$ (or smaller than 5e17 cm$^{-3}$, or smaller than 1e17 cm$^{-3}$). For example, a highest doping plateau may comprise an average doping concentration higher than 1e18 cm$^{-3}$ (or higher than 5e18 cm$^{-3}$, or higher than 1e19 cm$^{-3}$). The highest doping plateau may be the doping plateau of the plurality of doping plateaus located closest to the highly doped portion. For example, the plurality of doping plateaus may occupy more than 50% (or more than 70% or more than 90%) of a vertical extension of the compensation portion 106 and the transition areas between the plateaus of the plurality of doping plateaus occupy less than 50% (or less than 30% or less than 10%) of the vertical extension of the compensation portion 106.

Optionally, the gradient of the net doping concentration within the compensation portion 106 varies by less than 30% from an average gradient of the net doping concentration within the compensation portion 106. In other words, the increase of the net doping concentration within the compensation portion may be substantially linear.

Optionally, a maximum doping concentration of dopants of the first conductivity type within the compensation portion 106 may be higher than 1e17 cm$^{-3}$ (or higher than 5e17 cm$^{-3}$, or higher than 1e18 cm$^{-3}$). For example, the first conductivity type dopant can counter-dope some parts of the compensation portion 106 in order to provide a specific net doping profile. For example, a maximum doping concentration of dopants of the first conductivity type within the compensation portion may be located at the first area of the compensation portion.

For example, a majority (e.g. more than 80%) of dopant atoms within the compensation portion 106 may be nitrogen atoms or phosphor atoms. For example, nitrogen and phosphor may be used in a SiC semiconductor device as nitrogen and phosphor comprise a relatively small distance to the conduction band edge compared to other dopants in SiC substrate material. For example, more than 80% of all doping atoms within the compensation portion 106 may be nitrogen atoms. For example, doping atoms are atoms, which are able to influence the conductivity of semiconductor material. Nitrogen may be used, since diffusion of nitrogen in SiC is very low.

Optionally, a field stop or field stop portion may be located between the compensation portion 106 and the drift portion 104. The field stop portion may comprise a maximum net doping concentration lower than 1e17 cm$^{-3}$.

The first doping region 102 of the wide band gap semiconductor device 100 comprises the first conductivity type (e.g. n or p) and the second doping region of the wide band gap semiconductor device 100 comprises the second conductivity type (e.g. p or n). In other words, the first doping region 102 comprises the first conductivity type which can be a p-doping (e.g. caused by incorporating aluminum ions or boron ions) or an n-doping (e.g. caused by incorporating nitrogen ions, phosphor ions or arsenic ions). Consequently, the second conductivity type indicates an opposite n-doping or p-doping. In other words, the first conductivity type may indicate an n-doping and the second conductivity type may indicate a p-doping, or vice-versa.

The wide band gap semiconductor may be a wide band gap semiconductor substrate. For example, the wide band gap semiconductor substrate may be an epitaxial semiconductor layer or a semiconductor base substrate and a epitaxial semiconductor layer. The wide band gap semiconductor may be a substrate, since comprises an epitaxial grown layer or is used to grow an epitaxial layer and/or is used to grow or deposit one or more insulating or conductive layers on a frontside or backside of the wide band gap semiconductor. A frontside surface of the wide band gap semiconductor substrate may be a semiconductor surface of the wide band gap semiconductor substrate towards metal layers, insulation layers or passivation layers on top of the semiconductor surface. In comparison to a basically vertical edge (e.g. resulting from separating the semiconductor substrate from others) of the semiconductor substrate, the frontside surface of the semiconductor substrate may be a substantially horizontal surface extending laterally. The frontside surface of the semiconductor substrate may be a substantially even plane (e.g. neglecting unevenness of the semiconductor structure due to the manufacturing process or trenches). For example, the frontside surface of the semiconductor substrate may be the interface between the semiconductor material and an insulation layer, metal layer or passivation layer on top of the semiconductor substrate. A frontside of the wide band gap semiconductor substrate may be the side used to implement more sophisticated and complex structures (e.g. gates of transistors and/or wiring structures) than at the backside of the semiconductor substrate, since the process parameters (e.g. temperature) and the handling may be limited for the backside, if structures are already formed at one side of the semiconductor substrate, for example.

One or more lateral and vertical wiring layers may be located at the frontside of the wide band gap semiconductor substrate to connect electrical element structures (e.g. transistors) to each other or to contact pads. A lateral wiring layer (e.g. metal layer of a layer stack of a semiconductor device) may be a layer for implementing lateral electrical connections between vertical electrical connections (vias) connecting lateral wiring layers. A vertical wiring layer (e.g. via layer of a layer stack of a semiconductor device) may be a layer for implementing vertical electrical connections (vias) between lateral wiring layers.

For example, the wide band gap semiconductor substrate has a band gap larger than the band gap of silicon (1.1 eV). For example, the wide band gap semiconductor substrate may be a silicon carbide (SiC)-based semiconductor substrate, or gallium arsenide (GaAs)-based semiconductor substrate, or a gallium nitride (GaN)-based semiconductor substrate. For example, the wide band gap semiconductor substrate is a silicon carbide substrate. The wide band gap semiconductor substrate may be a semiconductor wafer or a semiconductor die.

For example, a vertical direction, a vertical distance, a vertical extension and a vertical dimension or thicknesses of layers may be measured orthogonal to a frontside surface of the wide band gap semiconductor substrate and a lateral direction and lateral dimensions may be measured in parallel to the frontside surface of the wide band gap semiconductor substrate.

The wide band gap semiconductor substrate may comprise a cell region (or active region) laterally surrounded by an edge termination region. The cell region may be a region of the semiconductor substrate used to conduct more than 90% of a current through the semiconductor substrate in an on-state or conducting state of the transistor arrangement (or the whole semiconductor device). For example, the cell region may be an area containing all source regions of a transistor arrangement or of all transistor structures of the semiconductor device. The edge termination region may be located between an edge of the semiconductor substrate and the cell region in order to support or block or reduce or dissipate a maximum voltage applied between the frontside surface of the semiconductor substrate and a backside surface of the semiconductor substrate within the cell region laterally towards the edge of the semiconductor substrate.

For example, the wide band gap semiconductor device 100 comprises an electrical element structure comprising the first doping region and the second doping region. The wide band gap semiconductor device 100 or the electrical element structure of the wide band gap semiconductor device 100 may be a diode, a triode, a transistor, a field-effect transistor, a metal-oxide-semiconductor field-effect transistor, a junction field-effect transistor, an insulated gate bipolar transistor, a bipolar transistor or a thyristor. The electrical element structure may be a vertical electrical element structure (e.g. vertical diode or vertical transistor) conducting current between a frontside surface of the semiconductor substrate and a backside surface of the wide band gap semiconductor substrate. For example, the first doping region and the second doping region of the wide band gap semiconductor device 100 may be located vertically stacked within the electrical element structure. The first doping region of the wide band gap semiconductor device 100 may be electrically connected to a wiring structure and/or to a contact pad and/or a metal layer at the frontside of the wide band gap semiconductor substrate. and The second doping region of the wide band gap semiconductor device 100 may be electrically connected to a contact metal layer at the backside of the wide band gap semiconductor substrate.

For example, the electrical element structure is a transistor arrangement (e.g. insulated gate field effect transistor IGFET, metal-oxide-semiconductor field effect transistor MOSFET or insulated gate bipolar transistor IGBT). The transistor arrangement may comprise a plurality of source doping regions connected to a source wiring structure, a plurality of gate electrodes or a gate electrode grid connected to a gate wiring structure and a backside drain metallization. For example, the electrical element structure is a transistor structure. The transistor structure may be a transistor cell of a plurality of transistor cells of a transistor arrangement. A transistor cell may comprise one or more source regions (e.g. distributed or located along a gate), at least one body region and a gate (e.g. a gate located within a gate trench extending into the semiconductor substrate), for example, Further, the transistor cells of the plurality of transistor cells may share a common (mutual) drift region (e.g. the drift portion of the second doping region) and/or a common drain region (e.g. the highly doped portion of the second doping region) or a common collector region (e.g. if the transistor cells are IGBT cells).

The wide band gap semiconductor device 100 may be a power semiconductor device. A power semiconductor device or an electrical element structure (e.g. transistor arrangement of the semiconductor device and/or diode arrangement of the semiconductor device) of the power semiconductor device may have a breakdown voltage or blocking voltage of more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

Due to the moderate increase of the net doping concentration within the compensation portion, charge carriers generated as a consequence of e.g. cosmic radiation may be effectively compensated by the fixed space charge of the depleted compensation region resulting in a reduction of the maximum dynamic electric field strength which is temporarily enhanced close to the chip backside during the cosmic radiation event. Therefore, wide band gap semiconductor devices comprising said compensation portion may for example resist a higher dose of cosmic radiation while maintaining their functionality. As a consequence, a robustness of the wide band gap semiconductor device against e.g. cosmic radiation may be increased. An effect may be an increased reliability and an increased life time of the wide band gap semiconductor device.

Optionally, the wide band gap semiconductor device has a vertical extension of the drift portion smaller than eight times a vertical distance between the first area of the compensation portion and the second area of the compensation portion. In other words, the compensation portion has a smaller relative vertical extension with respect to a vertical extension of the drift portion. The compensation portion may enable a protection against cosmic radiation caused streamers and therefore may increase a reliability of the wide band gap semiconductor device. A larger vertical extension of the compensation portion may further increase a functionality of the compensation portion.

Optionally, the wide band gap semiconductor device has a vertical extension of the drift portion larger than three times the vertical distance between the first area of the compensation portion and the second area of the compensation portion. In other words, the drift portion has a minimum relative vertical extension with respect to a vertical extension of the compensation portion or of the vertical distance between the first area of the compensation portion and the second area of the compensation portion, respectively. Reducing the relative vertical extension of the compensation portion may result in a reduced resistance of the wide band gap semiconductor device in an on-state. In this way, an efficiency of the wide band gap semiconductor device may be increased due to lower power dissipation in some examples.

Optionally, the wide band gap semiconductor device has a maximum doping concentration of dopants of the first conductivity type within the compensation portion higher than 1e17 cm$^{-3}$. In other words, although the net doping concentration of the compensation portion results in a second conductivity type within the compensation portion, the compensation portion of some embodiments may comprise first conductivity type dopants in a certain amount. The first conductivity type dopants may counter-dope some parts of the compensation portion in order to provide a specific doping profile. For example, providing a maximum doping concentration of dopants of the first conductivity type within the compensation portion may result in limiting the maximum gradient of the net doping concentration within the compensation portion.

Optionally, more than 80% of all doping atoms within the compensation portion of the wide band gap semiconductor device are nitrogen atoms. For example, nitrogen as a dopant in wide band gap semiconductor device, e.g. in a silicon carbide (SiC) semiconductor device, might not significantly diffuse within silicon carbide. For example, a doping profile using nitrogen as dopant may be implemented accurately and may vary hardly due to temperature budget during manufacturing.

Figure 2:
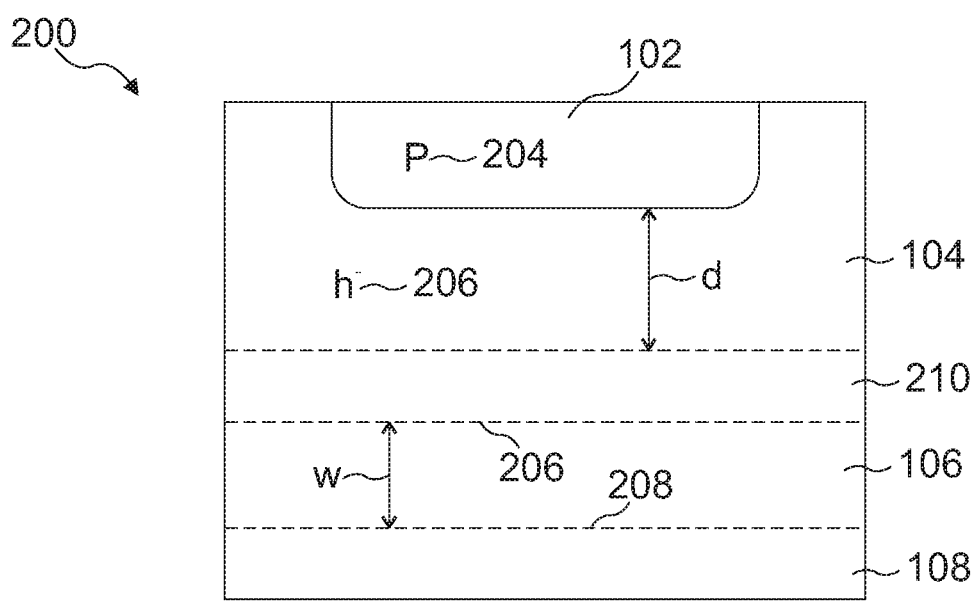
FIG. 2 shows a schematic illustration of a wide band gap semiconductor device with a n-doped drift portion.

FIG. 2 shows a schematic illustration of a wide band gap semiconductor device 200. The wide band gap semiconductor device 200 is implemented similar to the implementation of the wide band gap semiconductor device shown in FIG. 1. In addition, the wide band gap semiconductor device 200 comprises a field stop portion 210 located between the drift portion 104 and the compensation portion 106, or the first area 206 respectively. Further, a vertical extension d of the drift portion 104 is larger than a vertical extension w between the first area 206 of the compensation portion 106 and the second area 208 of the compensation portion 106.

Furthermore, the first doping region 204 is p-doped and the second doping region comprises the drift portion 104, the field stop 210, the compensation portion 106 and the highly doped portion 108, is n-doped.

More details and aspects are mentioned in connection with the embodiments described above or below. The embodiments shown in FIG. 2 may comprise one or more optional additional features corresponding to one or more aspects mentioned in connection with the proposed concept or one or more embodiments described above (e.g. FIGS. 1 and 3-7) or below.

Figure 3:
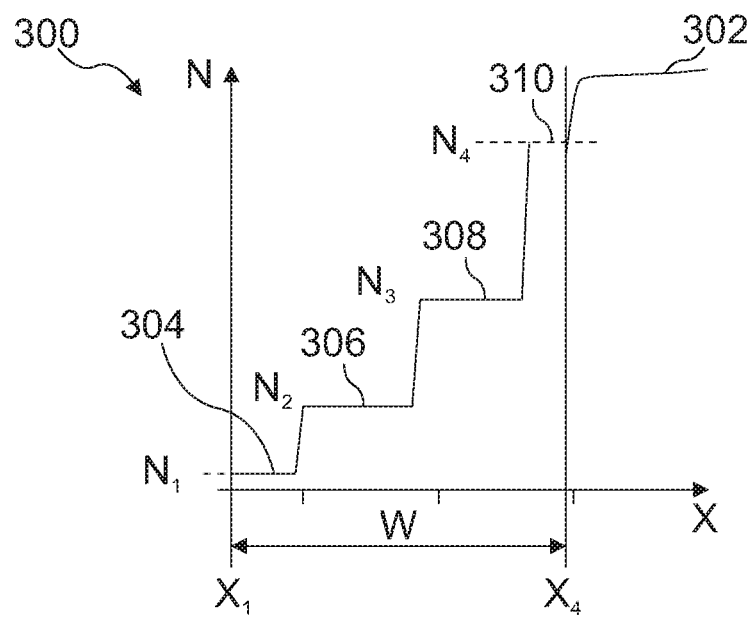
FIG. 3 shows a schematic illustration of a step shaped doping profile of a part of a wide band gap semiconductor device.

FIG. 3 shows a schematic illustration of a step-shaped doping profile of a compensation portion of a wide band gap semiconductor device. A net doping concentration N is shown in arbitrary units. A compensation portion with a vertical extension w extends from a first area X1 to a second area X4. The compensation portion is located next to a highly doped portion with a net doping concentration 302 higher than a net doping concentration of the compensation portion. The compensation portion comprises four doping plateaus 304, 306, 308, 310 with respective average net doping concentrations N1 to N4. The first doping plateau 304 can be the doping plateau located closest to a drift portion and has a corresponding lowest average net doping concentration N1 of the four doping concentrations N1 to N4. That is to say, N1 is smaller than N4. N4 by contrast can be the highest average net doping concentration of the four doping concentrations N1 to N4. The fourth doping plateau 310 can be located closest to the highly doped portion. The compensation portion can be positioned next to a drift zone and/or a field stop zone.

For example, the ratio of the extent of the drift zone d to the extent w of the charge carrier compensation zone (compensation portion) may be in a range between 10 and 2 or between 8 and 3. The higher the extend w, the better the structure may be suitable for a compensation of the electrons in a streamer. In case of unipolar devices, the illustrated structure may increase the resistance in the switched-on state. Thus, it may be selected not too wide. As the respective doping concentrations of the mentioned stages are in the middle and not in the low range, however, the increase of the resistance may be small as far as the extent w is not too big.

For example, it is proposed to provide a multi-stage doping zone, which serves as a charge carrier compensation zone and provides at least two or better four or more areas with a vertical extent of overall typically 1 to 5 micrometers, for example, and with a sufficient respective minimum concentration of the individual stages by means of e.g. epitaxy processes optionally in combination with special implantation steps.

For example, FIG. 3 may show an example of a doping profile of a compensation portion of a SiC semiconductor device. A minimum doping of the planes forming the charge carrier compensation zone which are located between the drift zone or field stop zone and the drain zone or substrate of a SiC based Power MOSFET or the SiC based diode, may be selected sufficiently high so that an effective compensation of the electron streams results flowing towards the backside in the streamer caused by cosmic radiation and consequently also an effective decrease of the field strength super elevation occurring in case of cosmic radiation are achieved.

A selection of the doping or net doping concentration can result from an assumed density of the electrons in the streamer. A streamer may comprise electrons. Their density may e.g. be calculated from a simulation. From the simple transposition of the Poisson equation for a field of e.g. $5.5 \cdot 10^6$ V/cm, which decreases to 0 within 2 µm, an effective density of $N_{eff}$ is equated to:

$$N_{eff} = \frac{\varepsilon}{q} \frac{dE}{dx} = 1.5 \cdot 10^{17} \text{cm}^{-3}$$

For example, the density of the electrons is $n=N_{eff}-N_D$. As an example, an assumed value of $N_D=1 \cdot 10^{16}$ cm$^{-3}$ for a 1200V SiC device results in $n=1.4 \cdot 10^{17}$ cm$^{-3}$. Thus, the number of electrons arriving in a streamer may lie within a same range as in the case of corresponding events in Silicon (Si). As the transitions in SiC as compared to those in Si are much more abrupt due to the very low diffusion coefficients of dopants in SiC, even very low electron densities in the streamer may lead to very high field peaks. The compensation zone may compensate for those electrons and limit a dynamic second field peak arising close to the chip backside during the cosmic radiation event. From this, a lower value may result in an average net doping concentration of $N_1=2 \cdot 10^{16}$ cm$^{-3}$ (in contrast e.g. to a drift zone doping with an average net doping concentration of approx. 1.1e16/cm$^3$ with a 1200V blocking device and/or 7e15/cm$^3$ for 1700V blocking capacity).

In examples with a very steep part of an electric field increase, a corresponding N of approx. $1.5 \cdot 10^{18}$ cm$^{-3}$ may be selected. The corresponding exemplary estimation shows a possible top limit of $N_4$ and/or $N_i$ if four and/or i doping stages or doping plateaus are provided. The first stage may be doped with $N_1$, the last one, for example with $N_4$. For example, the stage $N_1$ may at least comprise a doping of $N_D=2 \cdot 10^{16}$ cm$^{-3}$, the last stage at most $N_D=2 \cdot 10^{18}$ cm$^{-3}$. The total vertical extent of the sum of the realized several plateaus may consume between 50% and 98% or between 70% and 96% or between 80% and 95% of the total vertical extent of the compensation zone. Vice versa, the sum of the individual transition regions between the individual plateaus may consume between 2% and 50% or between 4% and 30% or between 5% and 20% of the total vertical extent of the compensation zone.

Figure 4:
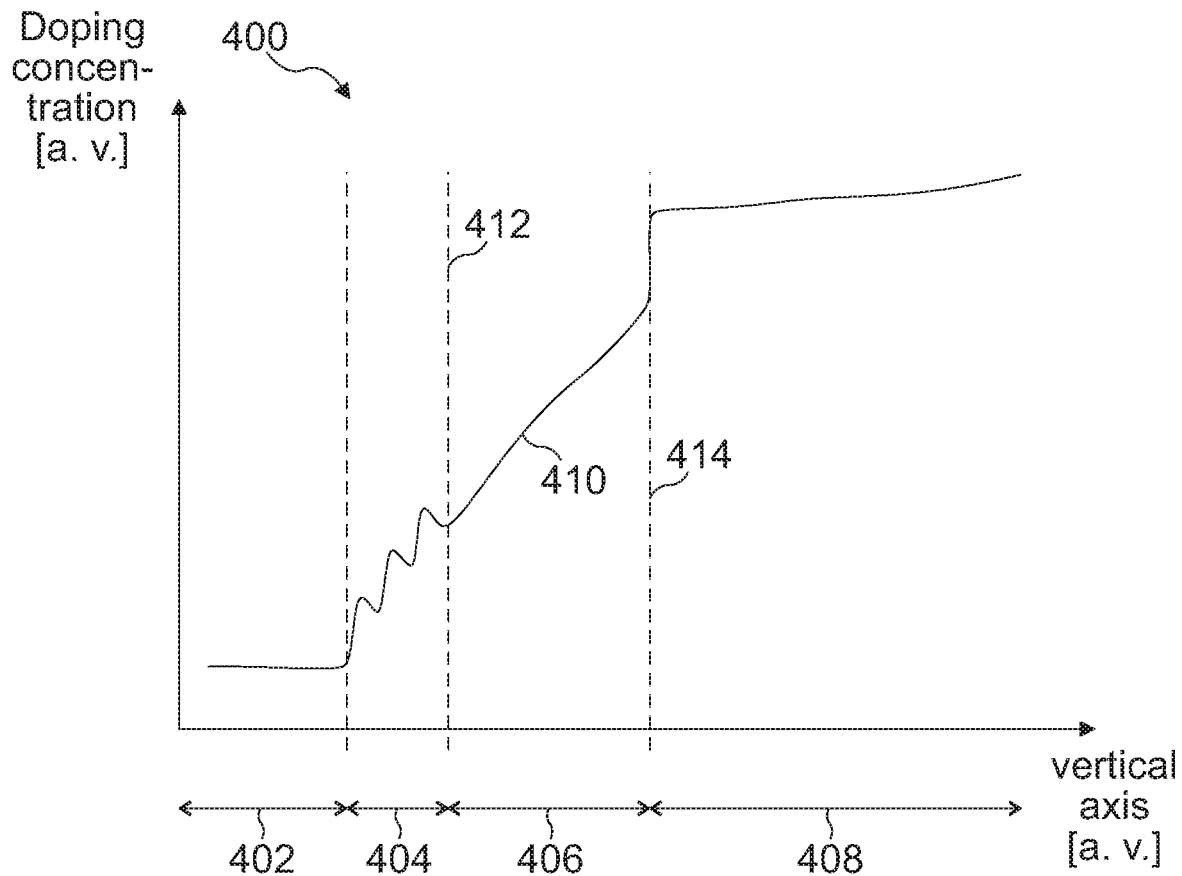
FIG. 4 shows a schematic illustration of a doping profile of a part of a wide band gap semiconductor device with a field stop portion.

FIG. 4 shows a schematic illustration of a doping profile of part of a wide band gap semiconductor device. The doping profile 400 is shown for a drift portion 402, a field stop 404, a compensation portion 406, and a highly doped portion 408 of the wide band gap semiconductor device. A gradient 410 of the net doping concentration of the compensation portion 406 varies by less than 30% or less than 15% or even less than 5% of an average gradient of the net doping concentration between a first area 412 and a second area 414 of the compensation portion 406. Thus, compensation portion 406 is an example for a compensation portion that does provide a relatively constant increase of the net doping concentration instead of providing doping plateaus.

Figure 5:
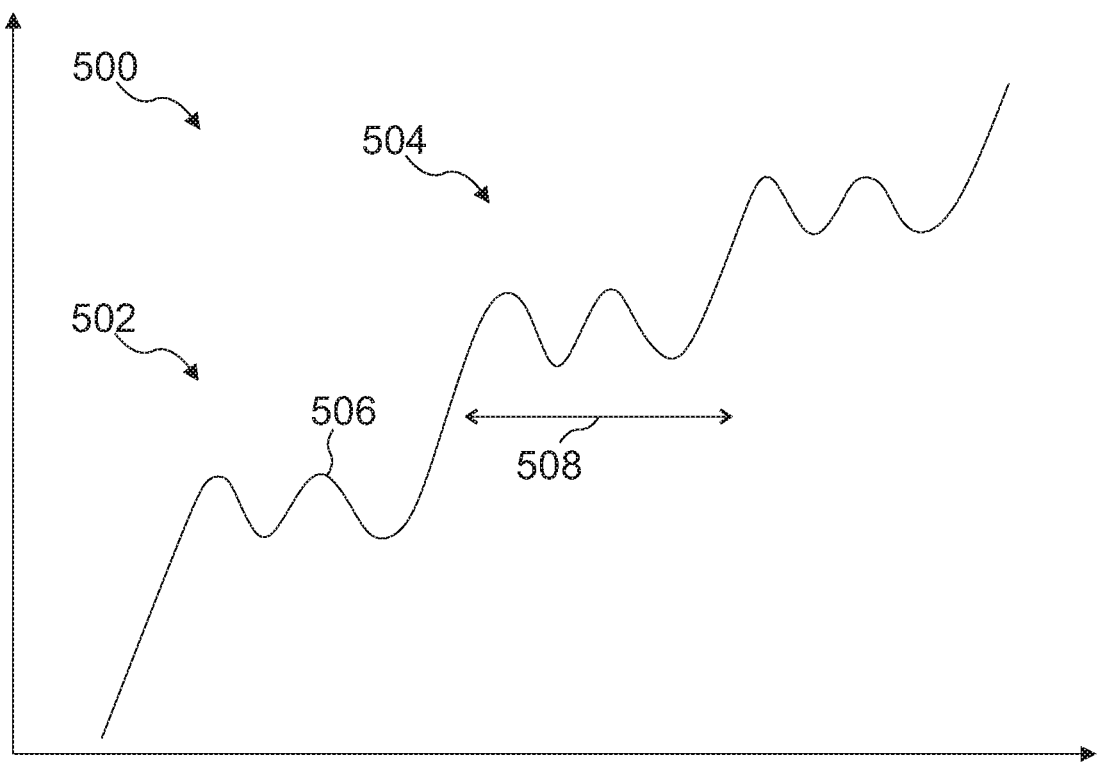
FIG. 5 shows a schematic illustration of a doping profile of a part of a wide band gap semiconductor device with local maxima and minima.

FIG. 5 illustrates a doping profile 500 of a compensation portion of a wide band gap semiconductor device. The doping profile 500 comprises a number of doping plateaus 502, 504. The doping plateaus comprise at least one local maximum net doping concentration 506. The doping plateau 504 comprises a vertical extension 508 larger than 50 nm and an average gradient within the doping plateau 504 is less than 1e19 cm$^{-4}$.

Figure 6:
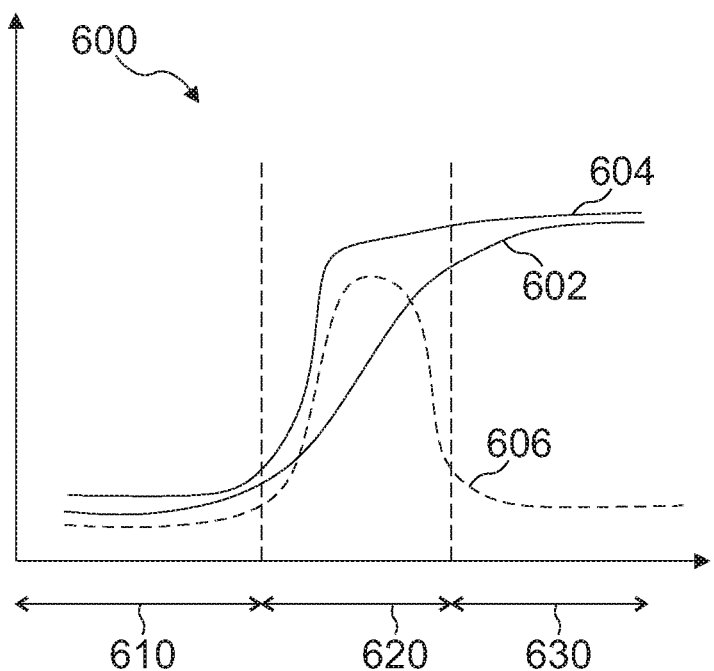
FIG. 6 shows a schematic illustration of a doping profile of a part of a wide band gap semiconductor device with a counter-doping in the compensation portion.

FIG. 6 illustrates a doping profile 600 of a wide band gap semiconductor device with a net doping concentration 602. The profile of the net doping concentration 602 is the result of a first doping concentration 604 of dopants of the second conductivity type and a second doping concentration 606 of dopants of the first conductivity type. Due to the counter-implantation of dopants of the first conductivity type, the gradient of the net doping concentration can be lowered below a desired maximum value within the compensation portion 620, while the net doping concentration in the drift portion 610 can be kept low and the net doping concentration in the highly doped portion 630 can be kept high.

Figure 7:
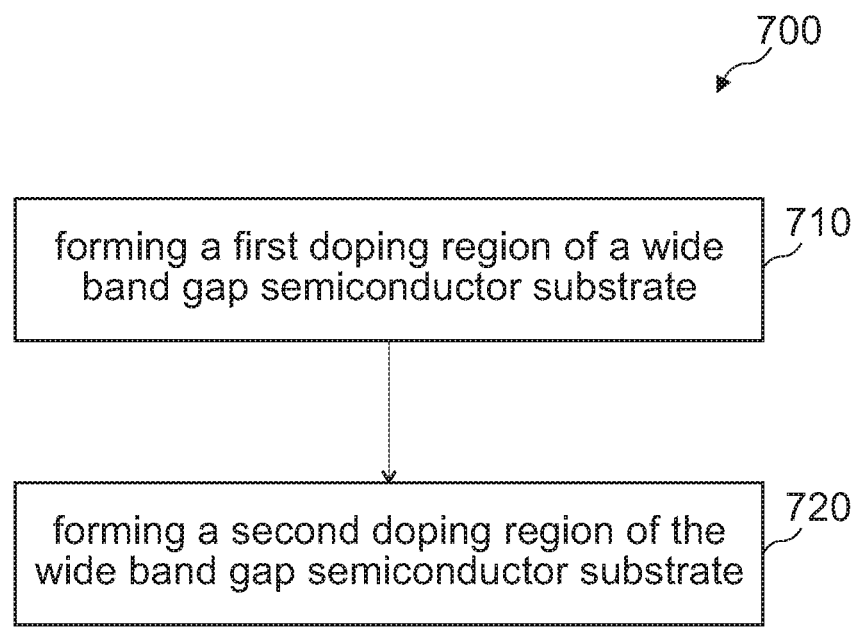
FIG. 7 shows a schematic illustration of a flow chart of a method.

FIG. 7 shows a flowchart of a method for forming a wide band gap semiconductor device according to an embodiment. The method 700 comprises forming 710 a first doping region of a wide band gap semiconductor substrate of the wide band gap semiconductor device. The first doping region is of a first conductivity type. Further, the method 700 comprises forming 720 a second doping region of the wide band gap semiconductor substrate. The second doping region is of a second conductivity type. The second doping region comprises a drift portion, a highly doped portion and a compensation portion. The drift portion of the second doping region has a first average net doping concentration lower than 1e17 cm-3 and the highly doped portion of the second doping region has a second average net doping concentration higher than 5e18 cm-3. Further, the compensation portion of the second doping region is located between the drift portion and the highly doped portion. The compensation portion extends from a first area comprising a net doping concentration higher than 1e16 cm-3 and lower than 1e17 cm-3 to a second area having a net doping concentration higher than 5e18 cm-3. A maximum gradient of the net doping concentration within at least a part of the compensation portion extending from the second area towards the first area for at least 100 nm is lower than 5e22 cm-4.

Due to forming the compensation portion and its respective doping profile or specific net doping concentration, charge carriers that are generated, e.g. as a consequence of cosmic radiation, may be at least partially compensated within the formed wide band gap semiconductor device. Therefore, wide band gap semiconductor devices formed according to the method and comprising a compensation portion may, for example, resist a higher dose of cosmic radiation and higher applied blocking voltages during the cosmic radiation event while maintaining their functionality. As a consequence, a robustness of the wide band gap semiconductor device, e.g. against cosmic radiation, can be increased by providing devices according to the method. The effect can be an increased reliability and an increased life time of wide band gap semiconductor devices that are formed according to the proposed method.

The second doping region may be formed before the first doping region or some processes (e.g. epitaxial growth of semiconductor material for the second doping region) used for forming the second doping region may be performed before forming the first doping region, while other processes (e.g. implantation of dopants for the creation of e.g. source zones) may be performed after forming the first doping region.

For example, forming the second doping region comprises epitaxial growth of an epitaxial wide band gap semiconductor layer on a wide band gap semiconductor base substrate, wherein the drift portion and the compensation portion are located in the epitaxial wide band gap semiconductor layer. A desired doping profile within the compensation portion and/or the drift portion may be formed by varying a dopant concentration, in particular over time, during the epitaxial growth.

A desired doping concentration in the highly doped portion (e.g. backside contact portion of a diode, drain region of a field effect transistor or emitter/collector region of an IGBT) may be provided by the doping concentration of the wide band gap semiconductor base substrate or by implantation of dopants from a backside of the wide band gap semiconductor substrate (e.g. after thinning the wide band gap semiconductor substrate from the backside).

Alternatively, the method 700 may further comprise implanting dopants of the second conductivity type through the drift portion after the epitaxial growth of the epitaxial wide band gap semiconductor layer to form at least a part of a desired doping profile in the compensation portion. The drift portion may broaden the implantation energy distribution of the dopants so that a smoother doping profile may be obtained.

Alternatively or additionally, dopants of the second conductivity type may be implanted before forming a portion of the epitaxial wide band gap semiconductor layer comprising the drift portion to form at least a part of a desired doping profile in the compensation portion. For example, an implantation energy filter may be used for implanting the dopants of the second conductivity type, wherein the implantation energy filter is configured to broaden an implantation energy distribution of the ion beam used for the implantation of the dopants of the second conductivity type.

Alternatively or additionally, a counter-implantation may be used to reduce the net doping concentration within a desired part of the second doping region to obtain a desired doping profile. For example, the method 700 may further comprise implanting dopants (e.g. boron atoms) of the first conductivity type into the compensation portion to form at least a part of a desired doping profile in the compensation portion.

Optionally, the epitaxy process may also be interrupted once or several times during the generation of the backside charge carrier compensation zone to enable a full-area implantation of donators and thus a fine-tuning of the resulting doping profile and prevent doping inhomogeneities caused by epitaxy and also enable a better reproducibility of the realized doping profiles, for example. As nitrogen substantially does not diffuse in SiC, in an example with a doping plateau, a desired vertical extend of the doping plateau may be acquired by using variable implantation energies. In particular when using this variant, a wavy distribution of the doping profile may arise, (e.g. each doping plateau comprises a maximum with a falling edge on both sides). Depending on the number of used implantation energies, several implantation maxima may arise along the quasi-plateaus. Alternatively, the energy filter principle may be applied, which enables a significant widening of the end-of-range from implantation. Also, the drift zone, in particular the SiC drift zone, may be used as kind of an energy filter. This can be done, for instance, by depositing a substantial part of the drift zone before multi-implantation may take place. Consequently, by radiating through the zone formed in such a way, a substantially higher vertical extent of the half width of the end-of-range peak may result.

In case a variant with a gradual transition or several stages with gradual transitions is desired instead of a multi-stage profile with a dominant step-shape, the desired doping gradients may e.g. be controlled by a time-dependent addition of nitrogen atoms during the epitaxy process. Alternatively, this may also be realized by a suitable combination of varying the implantation energy and the implantation dose. The pre-defined doping gradients may be lower than e.g. $5 \times 10^{22}$ cm$^{-4}$ and may exceed $1 \times 10^{21}$ cm$^{-4}$.

Alternatively, the doping gradient may be acquired by implanting an acceptor into the n+ substrate before the first Epi (growth of epitaxial layer) or after buffer growth (growth of the compensation portion), with a maximum concentration on the surface to acquire the highest compensation there and towards depth decreasing concentrations to consequently acquire the desired gradient in net donator concentration. When using Al or Ga, the use of a multi-implantation or the use of the energy filter method may be used. In particular when using boron, it may be considered that due to the non-negligible diffusion of boron in the buffer layer and/or in the SiC substrate, a gradual distribution of the resulting doping of the charge carrier compensation zone may arise. The implantation doses and/or implantation energies may be optimized accordingly. Further, the high recombination efficiency of the incorporated boron atoms may additionally suppress or at least strongly reduce the distribution of undesired stacking errors.

More details and aspects are mentioned in connection with the embodiments described above or below. The embodiments shown in FIG. 7 may comprise one or more optional additional features corresponding to one or more aspects mentioned in connection with the proposed concept or one or more embodiments described above (e.g. FIG. 1-6) or below.

Some embodiments relate to an apparatus for forming a wide band gap semiconductor device. The apparatus comprises means for forming a first doping region of a wide band gap semiconductor substrate of the wide band gap semiconductor device. The apparatus further comprises means for forming a second doping region of the wide band gap semiconductor substrate with a compensation portion in the wide band gap semiconductor substrate located between a drift portion and a highly doped portion of the second doping region. The apparatus further comprises means for providing a net doping concentration of the compensation portion with a maximum gradient smaller than 5e22 cm$^{-4}$ between a first area and a second area, the first area comprising a net doping concentration higher than 1e16 cm$^{-3}$ and lower than 1e17 cm$^{-3}$, and the second area comprising a net doping concentration higher than 5e18 cm$^{-3}$. The apparatus may enable to form, or provide, or manufacture wide band gap semiconductor devices with improved robustness against specific external events like cosmic radiation and cosmic-radiation-induced streamers within the wide band gap semiconductor devices.

Some embodiments relate to wide band gap devices with improved cosmic radiation resistance or stability. The proposed method may be used for manufacturing SiC power semiconductors or corresponding devices. An example of a proposed compensation zone, in particular for compensation of streamers, may be applied with SiC MOSFETs, JFETs, Schottky diodes and/or MPS (Merged Pin-Schottky) diodes. The compensation zone may be arranged between n$^-$ zone/field stop zone and substrate. However, for SiC-based IGBTs, such a zone may also be used, wherein in this case it is implemented between the drift zone or the field stop zone and a p-emitter, for example.

For example, realization of multi-stage or graded charge carrier compensation zones is proposed for improving the stability against cosmic radiation of SiC based power semiconductors by means of a corresponding targeted variation of the implantation doses and implantation energies of the nitrogen atoms or also the time-dependent nitrogen addition of dopants during the epitaxy process. Structurally, also a backside n-doped charge carrier compensation zone with several plateaus and/or plateau-like areas (i.e. quasi plateaus) is proposed. Optionally, such a compensation zone may be combined with average net doping concentration transition areas of sufficient extent in the vertical direction, which transition areas have a gradient of the net doping concentration of e.g. below $5 \times 10^{22}$ cm$^{-4}$ and above $1 \times 10^{21}$ cm$^{-4}$. A minimum net doping concentration in these transition areas may lie within the range of the electron density occurring in the respective critical operating state.

To realize such doping profiles for SiC, in particular epitaxy-based processes can be suitable. For the epitaxy process, different possibilities may be considered which can use, in particular, the combination of different method steps. Doping plateaus or a graded increase or decrease in the doping may be generated. The dopant incorporation is determined by different parameters like deposition rate, deposition temperature, carbon and/or ratio in the gaseous phase or dopant gas flow. Furthermore, the carbon and/or silicon rate can be used to influence the doping incorporation at a given dopant precursor gas concentration.

For reasons of costs, a process may be used which enables the production of charge carrier compensation zone and drift zone (and optionally also an upstream field stop zone) one after the other in one deposition; e.g. if possible without interruption. For example, for the doping of this charge carrier compensation zone in SiC, nitrogen or phosphor or both are used, in particular because nitrogen or phosphor—as compared to other dopants in the SiC—comprise a relatively small distance to the conduction band edge.

Alternatively, the required charge carrier compensation zone may also be generated by implantation into a buffer zone (epitaxial layer of the compensation portion) (e.g. also by means of energy filters to prevent multiple implantations of individual energies and thus unstable doping gradients.), before the drift zone is grown epitaxially.

The proposed method and/or doping profiles may be measured or detected by doping profile analyses (e.g. Spreading Resistance or capacitance-voltage CV measurements).

Other examples of structures may enable to facilitate an improvement of stability against cosmic radiation of power semiconductors by special default doping profiles. Such doping profiles may be difficult to realize for SiC devices, however, as a diffusion of the incorporated dopants may be largely excluded. Structures from other examples may not simply be applied to a wide band gap device. As in that case the critical field strength is higher, the doping conditions are different. Likewise, in case of SiC it is difficult or impossible to generate layers with a defined gradient, as defining the gradient is done with Si by diffusion.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof The aspects and features mentioned and described together with one or more of the previously detailed examples and figures may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A wide band gap semiconductor device, comprising:
a first doping region of a first conductivity type; and
a second doping region of a second conductivity type,
wherein a drift portion of the second doping region has a first average net doping concentration lower than 1e17 cm$^{-3}$,
wherein a highly doped portion of the second doping region has a second average net doping concentration higher than 5e18 cm$^{-3}$,
wherein a compensation portion of the second doping region is located between the drift portion and the highly doped portion,
wherein the compensation portion extends from a first area of the compensation portion having a net doping concentration higher than 1e16 cm$^{-3}$ and lower than 1e17 cm$^{-3}$ to a second area of the compensation portion having a net doping concentration higher than 5e18 cm$^{-3}$,
wherein a maximum gradient of the net doping concentration within at least a part of the compensation portion (106) extending from the second area towards the first area for at least 100 nm is lower than 5e22 cm$^{-4}$.

2. The wide band gap semiconductor device of claim 1, wherein a vertical extension of the drift portion is smaller than eight times a vertical distance between the first area of the compensation portion and the second area of the compensation portion.

3. The wide band gap semiconductor device of claim 1, wherein a vertical extension of the drift portion is larger than three times a vertical distance between the first area of the compensation portion and the second area of the compensation portion.

4. The wide band gap semiconductor device of claim 1, wherein a vertical extension of the compensation portion is larger than 1 µm and smaller than 5 µm.

5. The wide band gap semiconductor device of claim 1, wherein a vertical doping profile of the compensation portion comprises a doping plateau, wherein the doping plateau has an average gradient of a net doping concentration of less than 1e21 cm$^{-4}$, and wherein the doping plateau has a vertical extension of more than 50 nm.

6. The wide band gap semiconductor device of claim 5, wherein the vertical doping profile comprises a plurality of doping plateaus, wherein an average gradient of the net doping concentration of at least one of the plateaus is less than 5e20 cm$^{-4}$.

7. The wide band gap semiconductor device of claim 6, wherein the plurality of doping plateaus occupy more than 50% of a vertical extension of the compensation portion and/or transition areas between the plateaus of the plurality of doping plateaus occupy less than 50% of the vertical extension of the compensation portion.

8. The wide band gap semiconductor device of claim 6, wherein the doping profile comprises a highest doping plateau with an average doping concentration higher than 1e18 cm$^{-3}$, and wherein the highest doping plateau is the doping plateau of the plurality of doping plateaus that is located closest to the highly doped portion.

9. The wide band gap semiconductor device of claim 1, wherein a gradient of the net doping concentration within the compensation portion varies by less than 30% from an average gradient of the net doping concentration within the compensation portion.

10. The wide band gap semiconductor device of claim 1, wherein a maximum doping concentration of dopants of the first conductivity type within the compensation portion is higher than 1e17 cm$^{-3}$.

11. The wide band gap semiconductor device of claim 1, wherein more than 80% of all doping atoms within the compensation portion are nitrogen atoms.

12. The wide band gap semiconductor device of claim 1, wherein a breakdown voltage of an electrical element structure of the wide band gap semiconductor device is higher than 100 V.

13. The wide band gap semiconductor device of claim 1, wherein the first doping region is one of an anode region of a diode, a cathode region of a diode, a body region of a field effect transistor, and a base region of a bipolar transistor.

14. The wide band gap semiconductor device of claim 1, wherein the first doping region is located adjacent to the second doping region so that a p-n-junction is formed between the first doping region and the second doping region.

15. The wide band gap semiconductor device of claim 1, wherein the wide band gap semiconductor substrate is a silicon carbide substrate.

* * * * *